US007232753B2

(12) United States Patent
Koh

(10) Patent No.: US 7,232,753 B2
(45) Date of Patent: Jun. 19, 2007

(54) METHOD OF FABRICATING SEMICONDUCTOR DEVICE

(75) Inventor: Kwan Joo Koh, Bucheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 11/024,659

(22) Filed: Dec. 30, 2004

(65) Prior Publication Data
US 2005/0153499 A1    Jul. 14, 2005

(30) Foreign Application Priority Data
Dec. 31, 2003    (KR) ............. 10-2003-0101473

(51) Int. Cl.
*H01L 21/4763* (2006.01)
(52) U.S. Cl. ............. 438/643; 438/648; 257/E21.17
(58) Field of Classification Search ............. 438/643, 438/648, 680, 681; 257/E21.17
See application file for complete search history.

(56) References Cited

U.S. PATENT DOCUMENTS

| | | | |
|---|---|---|---|
| 4,701,349 A * | 10/1987 | Koyanagi et al. ........... 438/655 |
| 5,512,495 A * | 4/1996 | Mei et al. ........... 438/286 |
| 5,648,673 A * | 7/1997 | Yasuda ........... 257/382 |
| 5,654,235 A * | 8/1997 | Matsumoto et al. ........ 438/643 |
| 5,776,830 A * | 7/1998 | Sumi et al. ........... 438/643 |
| 5,780,356 A * | 7/1998 | Kim ........... 438/627 |
| 5,895,267 A * | 4/1999 | Zhao et al. ........... 438/627 |
| 5,933,741 A * | 8/1999 | Tseng ........... 438/305 |
| 6,169,017 B1 * | 1/2001 | Lee ........... 438/585 |
| 6,177,338 B1 * | 1/2001 | Liaw et al. ........... 438/629 |
| 6,221,714 B1 * | 4/2001 | Jang ........... 438/241 |
| 6,303,431 B1 * | 10/2001 | Linliu ........... 438/253 |
| 6,855,630 B1 * | 2/2005 | Ruf et al. ........... 438/655 |
| 6,949,436 B2 * | 9/2005 | Buller et al. ........... 438/303 |
| 2001/0045661 A1 * | 11/2001 | Yang et al. ........... 257/763 |

FOREIGN PATENT DOCUMENTS

JP              64-000760    *    1/1989    ............. 438/297

* cited by examiner

Primary Examiner—Caridad M. Everhart
(74) Attorney, Agent, or Firm—Lowe Hauptman & Berner LLP

(57) ABSTRACT

A method of fabricating a semiconductor device, provide a simplification of the fabricating process by removing a step of forming an oxide film, and vapor depositing a nitride film, after forming a gate. The method of fabricating the semiconductor device includes the steps of forming a trench, a gate insulating film, and a poly gate on a substrate; forming a nitride film on the substrate; forming an LDD region by ion implantation using the gate as a mask; forming an oxide film on the substrate; forming a sidewall by etching the oxide film; forming a source/drain by ion implantation using the gate and the sidewall as masks; vapor depositing PMD over the substrate, and then planarizing the substrate; forming a contact hole by etching the PMD; and vapor depositing a barrier metal on the PMD, treating with heat, and filling up the contact hole.

5 Claims, 5 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, to a method of fabricating a semiconductor device, for simplifying a semiconductor fabricating process by changing such a process of removing a step of forming a vapor deposited poly oxide film by depositing a vapor deposited nitride film instead of a poly oxide film.

2. Discussion of the Related Art

A conventional method of fabricating a semiconductor includes the steps of forming a gate, creating an oxide film for protecting the gate, carrying out a Lightly Doped Drain (hereinafter called as LDD) ion implantation step, vapor depositing a cap oxide film and a nitride film, forming a side wall by etching the oxide film and nitride film, and forming the semiconductor device by implanting source/drain impurities therein. Later processes include the steps of carrying out dry etching and HF cleaning to remove the oxide film from a substrate, forming silicide by vapor depositing Ti or Co and carrying out heat treatment, and vapor depositing an insulating film to form a contact line.

The method of fabricating the related art semiconductor device has problems such as a contact margin becoming smaller as the integration of semiconductor device technology progresses, generating a contact spike in a trench insulating film developing a shortage owing to a reduced design margin, as well as many other problems.

SUMMARY OF THE INVENTION

Accordingly, the present invention is directed to a method of fabricating a semiconductor device that substantially obviates one or more of the above-identified and other problems due to limitations and disadvantages of the related art.

An object of the present invention is to provide a method of fabricating a semiconductor device, simplifying the fabricating process of the semiconductor device by forming a sidewall with an oxide so as to increase a contact margin and skipping processes such as removing oxide, forming silicide, and forming a PreMetallic Dielectric (hereinafter "PMD") liner.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with a purpose of the invention, as embodied and broadly described herein, a method of fabricating a semiconductor device includes the steps of forming a trench, a gate insulating film, and a poly gate on a substrate; forming a nitride film on the substrate; forming an LDD region by ion implantation using the gate as a mask; forming an oxide film on the substrate; forming a sidewall by etching the oxide film; forming a source/drain by ion implantation using the gate and the sidewall as masks; vapor depositing PMD over the substrate, and then planarizing the substrate; forming a contact hole by etching the PMD; and vapor depositing a barrier metal on the PMD, treating with heat, and filling up the contact hole.

Preferably, the nitride film is 200 to 500 Å thick.
Preferably, the oxide film is 500 to 2000 Å thick.
Preferably, the PMD is 4000 to 10000 Å thick.
Preferably, the barrier metal comprises TiN, and either Ti and Co.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
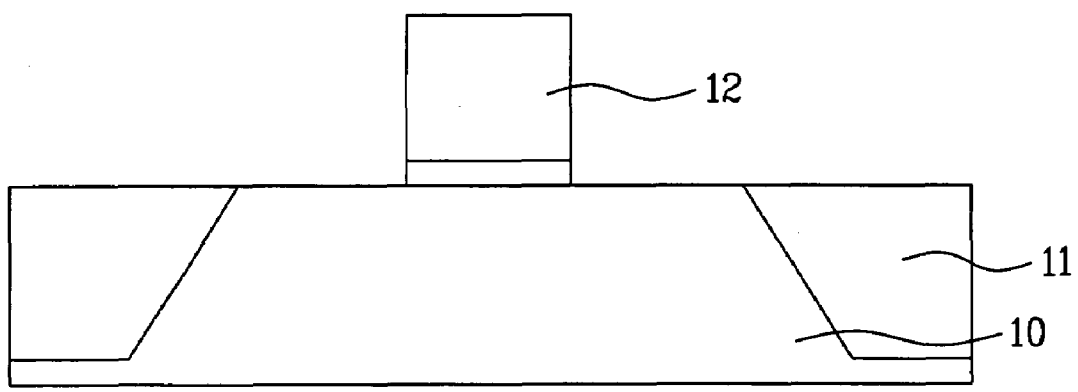
FIGS. 1 to 9 illustrate cross sectional views for describing a method of fabricating a semiconductor device in accordance with the present invention.

FIG. 1 to FIG. 9 illustrates cross-sectional views for describing a method of fabricating a semiconductor device in accordance with the present invention. First of all, FIG. 1 shows a step of forming a trench, a gate insulating film, and a poly gate on a substrate. As illustrated in FIG. 1, the step includes forming a trench on a substrate 10, the substrate 10 having a predetermined device (such as a transistor) formed thereon, forming a device separating film 11 by filling up the trench with the separating film 11, and forming a gate 12 by forming a gate oxide film and a poly silicon, forming a photoresist pattern and then etching the oxide film and the poly silicon film using the photoresist pattern.

Figure 2:
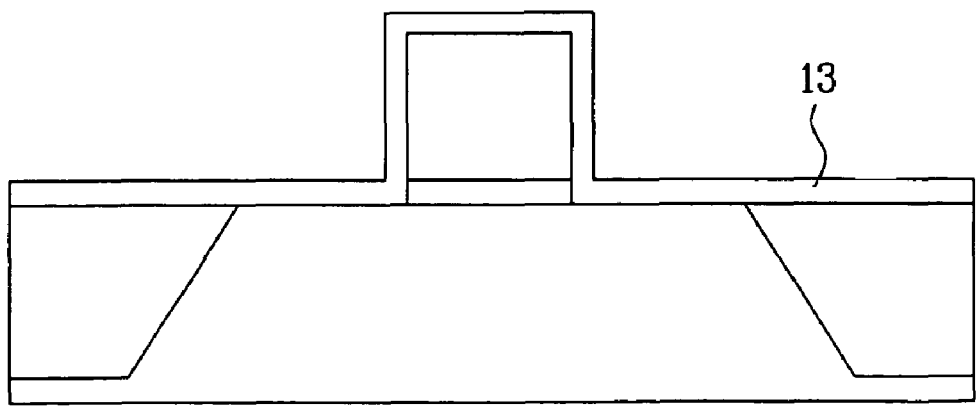

FIG. 2 shows a step of forming a nitride film on the substrate. As illustrated in FIG. 2, a nitride film 13 is formed on the substrate having the device separating film and the gate formed thereunder. In the related art, the oxide film is formed first, however, in the present invention, the nitride film is formed first in order to simplify the semiconductor fabricating process. In this case, the nitride film is formed to have a thickness in an inclusive range 200 through 500 Å thick.

Figure 3:
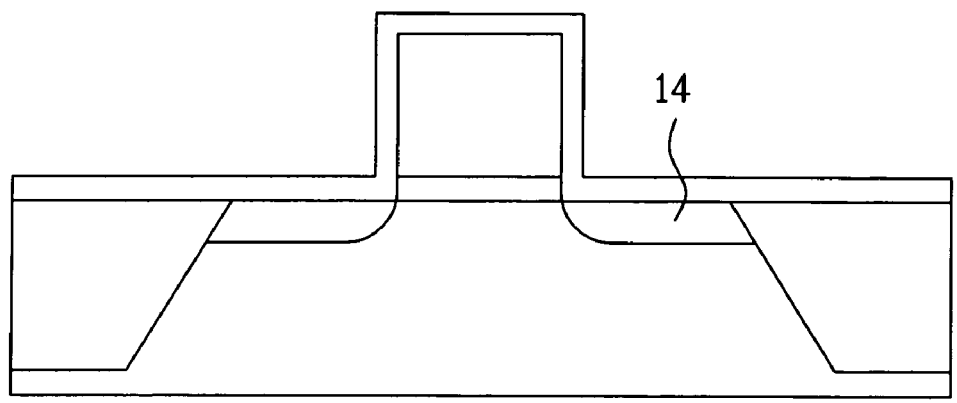

FIG. 3 shows a step of forming an LDD region by ion implantation using the gate as a mask. As illustrated in FIG. 3, the LDD 14 is formed by impurity ion implantation using the gate as a mask.

Figure 4:
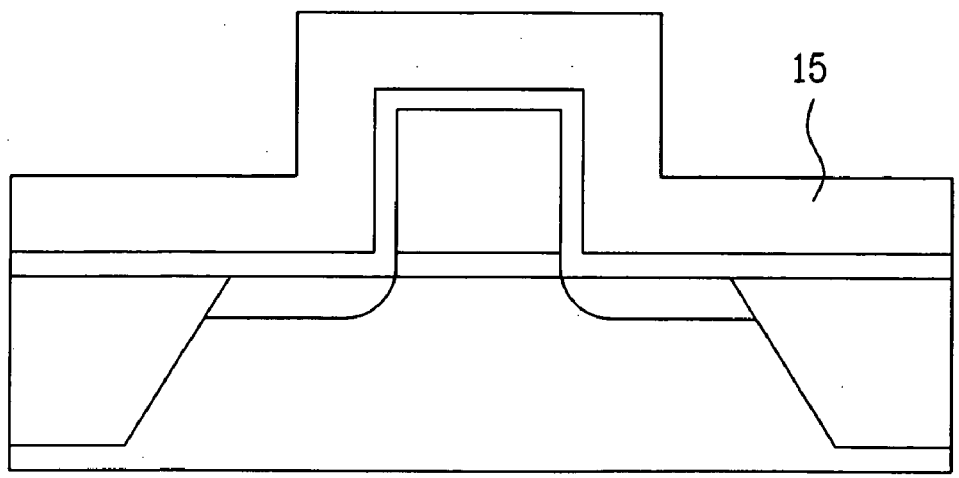

FIG. 4 shows a step of forming an oxide film on the substrate. As illustrated in FIG. 4, an oxide film 15 is formed on the substrate having the LDD formed thereon. In this case, the oxide film forms a sidewall of a gate by a following process. Accordingly, a thickness of the oxide film influences a margin of the contact hole, and thus the oxide film is formed to have a thickness in an inclusive range of 500 through 2000 Å.

Figure 5:
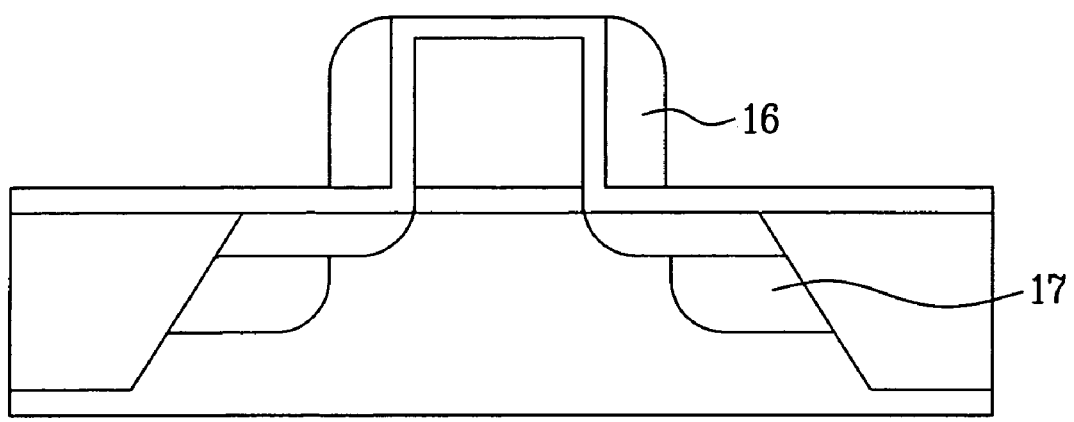

FIG. 5 shows steps of forming sidewalls by etching the oxide film, and forming source/drain regions by carrying out ion implantation using the gate and the sidewalls as masks. As illustrated in FIG. 5, an oxide film sidewall 16 is formed by etching the oxide film. Subsequently, a source/drain region 17 is formed by the impurity ion implantation using the gate and the sidewalls as the mask.

Figure 6:
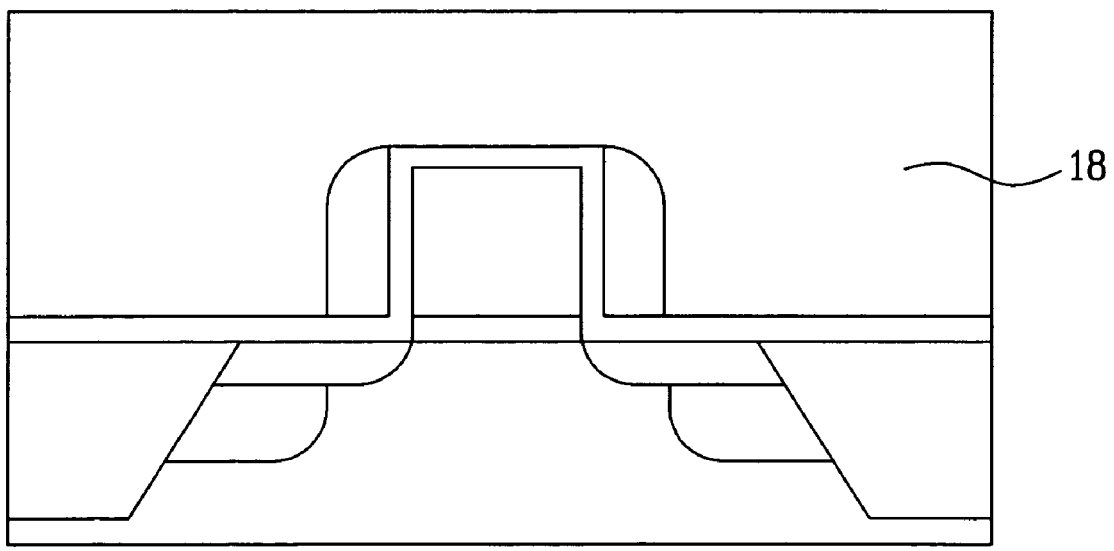

FIG. 6 shows a step of vapor depositing PMD on the substrate, and then planarizing the substrate. As illustrated in FIG. 6, an insulating film is formed between layers by vapor depositing a PMD 18 onto the substrate, and then planarizing the substrate. In this case, the PMD is formed of the oxide film. The PMD being planarized is 4000 through 10000 Å thick.

Figure 7:
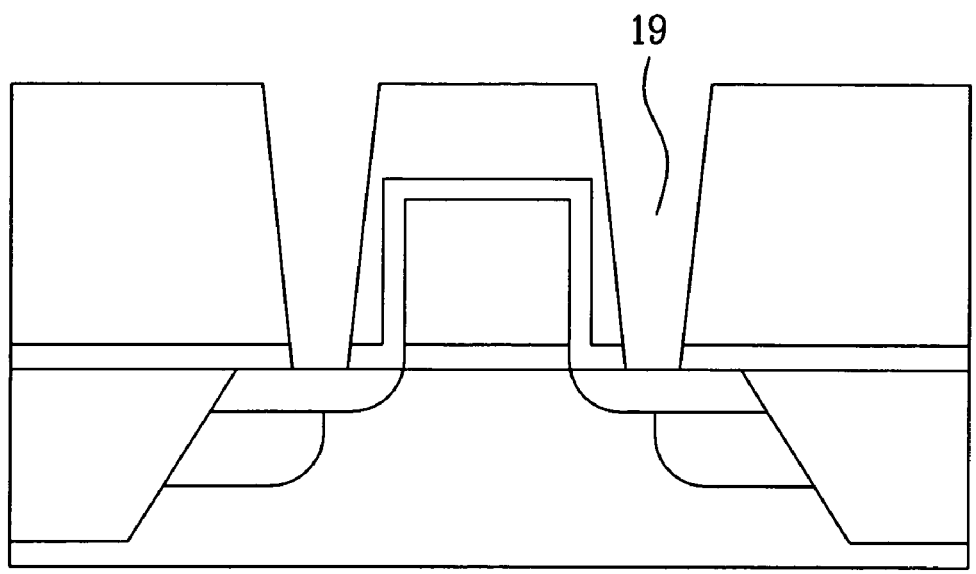

FIG. 7 illustrates a step of forming a contact hole by etching the PMD. As illustrated in FIG. 7, the planarized PMD is set into a given critical dimension (CD) so as to form a contact hole 19.

Figure 8:
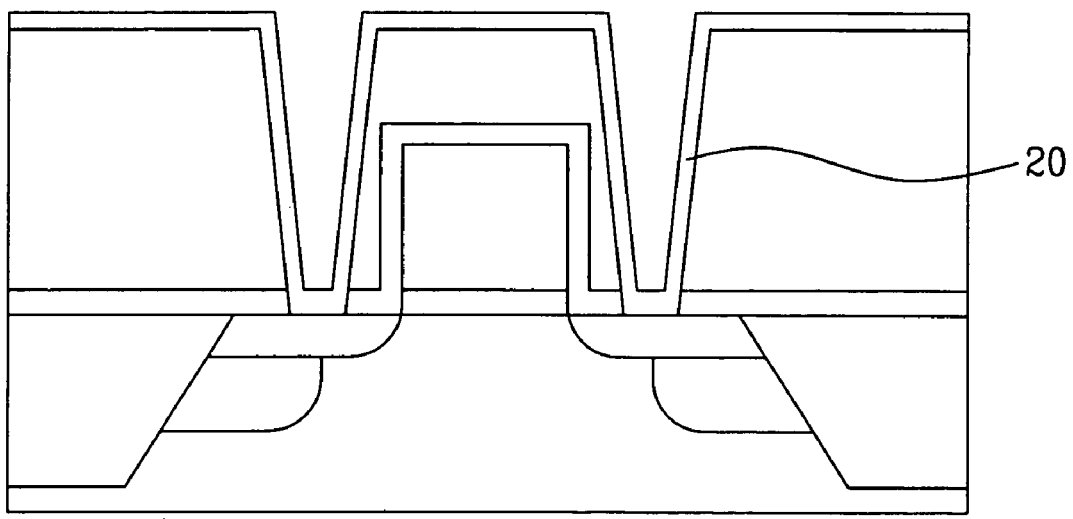

FIG. 8 shows a step of vapor depositing a barrier metal onto the PMD. As shown in FIG. 8, a barrier metal 20 is vapor deposited on the substrate having the contact hole formed thereon. In this instance, the barrier metal is formed of Ti or Co, and TiN. In other words, the Ti or Co is a material for forming silicide, and the TiN is formed for protecting impurities from spreading.

Figure 9:
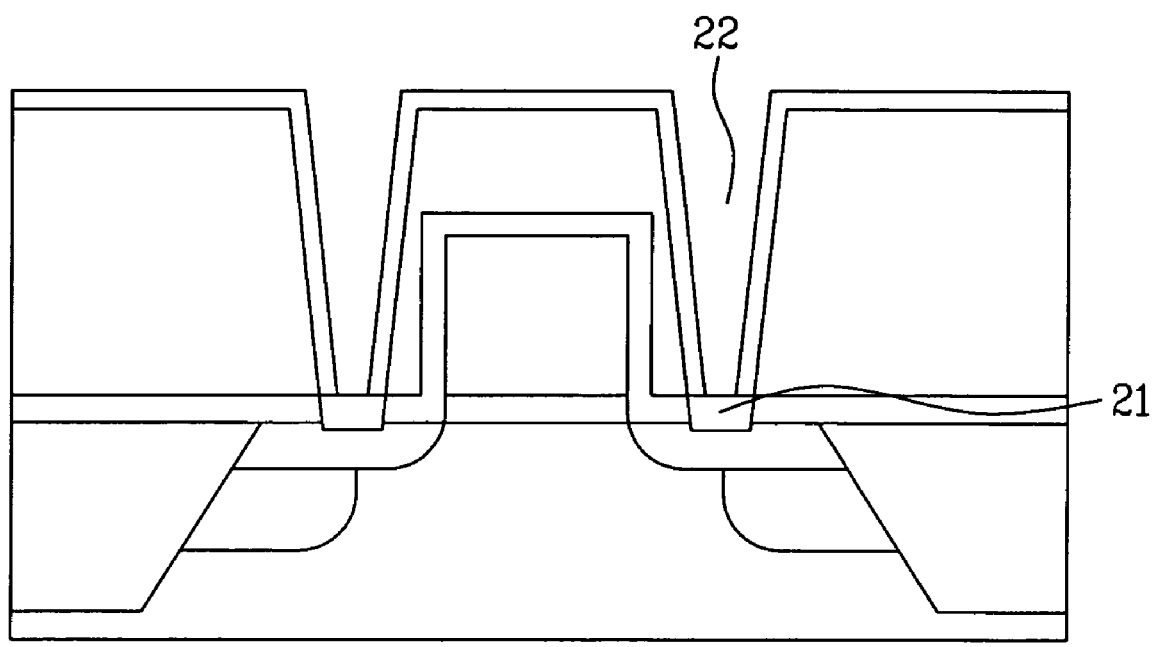

FIG. 9 shows a step of treating the substrate with heat and filling up the contact hole 22 with tungsten. As illustrated in FIG. 9, titanium silicide or cobalt silicide 21 is automatically formed on a lower surface of the contact hole 22 by treating the substrate with heat such that Ti or Co reacts on a lower part of the silicon substrate. Subsequently, the contact hole 22 is filled in by vapor depositing tungsten thereon and planarizing the contact hole.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

This application claims the benefit of Korean Application No. P2004-01473, filed on Dec. 31, 2003, which is hereby incorporated by reference in its entirety as if fully set forth herein.

Therefore, the method of fabricating the semiconductor device in accordance with the present invention has an effect that the semiconductor fabricating process is simplified by forming a sidewall with oxide so as to increase a contact margin, and skipping many process such as processes of removing oxide, forming silicide and forming PMD liner.

What is claimed is:

1. A method of fabricating a semiconductor device, comprising steps of:
    forming as part of a substrate a trench, a gate insulating film, and a poly gate on the substrate;
    forming a nitride film on the substrate;
    forming an LDD region in the substrate and beneath the nitride film by ion implantation using the poly gate as a mask;
    forming an oxide film on at least a portion of the nitride film on side portions of the poly gate;
    etching the oxide film to form a gate sidewall;
    ion implanting impurities in the substrate to form a source/drain using the gate and the sidewall as masks;
    vapor depositing PMD over the substrate including the gate sidewalls and the nitride film so as to form an upper layer and then planarizing the upper layer;
    etching the PMD to form a contact hole to the LDD region; and
    vapor depositing a barrier metal on the PMD, treating with heat, and filling up the contact hole.

2. The method of claim 1, wherein the step of forming a nitride film includes forming a film having a thickness in an inclusive range of 200 through 500 Å.

3. The method of claim 1, wherein the step of forming the oxide film includes forming a film having a thickness in an inclusive range of 500 through 2000 Å.

4. The method of claim 1, wherein the step of vapor depositing PMD includes forming a film having a thickness in an inclusive range of 4000 through 10000 Å.

5. The method of claim 1, wherein the step of vapor depositing the barrier metal comprises using TiN, and one of Ti and Co.

* * * * *